United States Patent Office 3,520,746
Patented July 14, 1970

3,520,746

METAL ETCH COMPOSITIONS

Donald Ben Johnson and John Ernest Peters, Racine, Wis., assignors to Printing Developments, Inc., New York, N.Y., a corporation of New York No Drawing. Filed Dec. 21, 1965, Ser. No. 515,441
Int. Cl. C23f *1/02*; G03f *7/16*
U.S. Cl. 156—14 7 Claims

ABSTRACT OF THE DISCLOSURE

A metal etch composition especially adapted for developing copper-coated aluminum bi-metallic plates, such as those used in the graphic arts field and in the printed circuit industry, which comprises an aqueous solution containing ferric nitrate copper-etching agent and a water-soluble or acid-soluble ionizable fluorine compound as a modifying agent to retard undercutting.

The present invention relates to metal etch compositions that provide superior reproduction on lithographic plates or other product made by etching away copper through a stencil to expose aluminum and to a process for using the same.

The present day metal etches used to produce copper-coated aluminum bi-metallic lithographic plates by selectively etching away copper through a stencil or developed resist coating to expose the aluminum base do not reproduce the stencil exactly. As the etch dissolves away the copper, it also attacks side-ways and tends to dissolve copper under the stencil. This action is known as undercutting. On lithographic plates, this undercutting reduces the size of the copper under the stencil and presents a serious problem when trying to obtain good reproduction. This problem has been solved to some extent on photoengravings by using banking agents and etching machines. However, on lithographic plates, these methods are not practical, because of the large size of the plates involved and the thinness of the upper copper layer to be removed.

The normal procedure followed in making a copper-coated aluminum bi-metallic lithographic plate, involves exposing the plate coated with a photosensitive resist through a photographic film to a strong source of light. After the resist has received sufficient light exposure to either harden or soften areas below the transparent portions of the film, a solvent is applied to the plate to remove the more soluble portions of the resist and thereby expose the copper surface in these areas. The unprotected copper is then etched away to expose the aluminum base.

Etching is usually done by pouring etch on the plate and agitating the solution by hand with a pad or swab until the unprotected copper is removed. With this method, it is impossible to etch away the copper in all areas uniformally. This, combined with the fact that the platemaker must be certain that all exposed copper is removed, results in most areas of the plate being over-etched significantly. This over-etching increases the undercutting and thus the reproduction problems.

Accordingly, it is the object of the present invention to improve reproduction characteristics by modifying a metal etch composition to retard undercutting when dissolving copper through a stencil.

The metal etch compositions of the invention for use in the developing or etching or copper-coated aluminum lithographic plates comprise an aqueous solution containing from about 6% to about 60% by weight of an etching agent and from about 0.1% to about 10% by weight of a modifying agent. The etching agent is either ferric nitrate or nitric acid, while the modifying agent is a water-soluble or acid-soluble ionizable fluorine compound, such as aluminum fluoride, ammonium fluoride, antimony fluoride, sodium fluoride, stannous fluoride, potassium fluoride, chromic fluoride, fluoboric acid, p-fluorobenzoic acid, p-fluoroaniline, fluoroform, and the like.

The minimum amount of modifying agent is necessary to prevent or greatly decrease undercutting while the maximum amount thereof is dictated primarily by economic considerations.

The compositions and process of the invention are illustrated by the following examples which are merely representative of the invention and not limiting thereof.

EXAMPLE 1

A copper-coated aluminum bi-metallic lithographic printing plate was made by applying a photosensitive water-insoluble quinone diazide resist to the plate and exposing the plate through a 150 line half-tone screen containing uniform dots 50 to 55 microns in diameter to an arc light for 4 minutes. The unhardened resist was removed by developing with a swab using a dilute alkaline resist developer or solvent to leave dots of resist coating that were 50 to 55 microns in diameter. This plate was then washed with water, dried and cut into four-inch strips to be used for comparative etching tests.

Under carefully controlled conditions at 75° F., one strip was etched with a 45% aqueous solution of ferric nitrate for 6 and for 12 minutes. Another identical strip was etched with the same 45% ferric nitrate solution containing 5% by weight ammonium fluoride under the same conditions and for the same periods of time. The two plates were then compared.

After 6 minutes, the strip etched with the aqueous ferric nitrate solution had completely lost approximately 65% of all dots and the remaining dots averaged only 10 to 15 microns in diameter, compared to an average dot diameter of approximately 50 microns with no dots lost on the strip etched with the metal etch of the invention, namely the aqueous solution containing 45% by weight ferric nitrate and 5% by weight ammonium fluoride.

After 12 minutes, the strip etched with the aqueous ferric nitrate solution had lost 100% of every dot compared to an average dot diameter of approximately 45 microns with no dots lost on the strip etched with the metal etch of the invention. This dramatic improvement was evident in many tests using various plate sizes.

EXAMPLES 2 THROUGH 13

Example 1 was repeated using an etch time of 4 minutes with the various comparative metal etch compositions set forth below.

| Example No.: | Metal etch composition |
|---|---|
| 2A | Saturated aqueous solution of ferric nitrate (60% by weight) plus 2% by weight ammonium fluoride. |
| 2B | Saturated aqueous solution of ferric nitrate (60% by weight). |
| 3A | Aqueous solution containing 6.5% by weight ferric nitrate plus 0.5% by weight ammonium fluoride. |
| 3B | Aqueous solution containing 6.5% by weight ferric nitrate. |
| 4A | Aqueous solution containing 45% by weight ferric nitrate plus 0.1% by weight ammonium fluoride. |
| 4B | Aqueous solution containing 45% by weight ferric nitrate. |
| 5A | Aqueous solution containing 45% by weight ferric nitrate plus 10% by weight ammonium fluoride. |
| 5B | Aqueous solution containing 45% by weight ferric nitrate. |

| Example No.: | Metal etch composition |
|---|---|
| 6A | Aqueous solution containing 45% by weight ferric nitrate plus 2% by weight ammonium fluoride. |
| 6B | Aqueous solution containing 45% by weight ferric nitrate. |
| 7A | Aqueous solution containing 45% by weight ferric nitrate plus 2% by weight sodium fluoride. |
| 7B | Aqueous solution containing 45% by weight ferric nitrate. |
| 8A | Aqueous solution containing 45% by weight ferric nitrate plus 2% by weight chromic fluoride. |
| 8B | Aqueous solution containing 45% by weight ferric nitrate. |
| 9A | Aqueous solution containing 45% by weight ferric nitrate plus 1% by weight fluoboric acid. |
| 9B | Aqueous solution containing 45% by weight ferric nitrate. |
| 10A | Aqueous solution containing 45% by weight ferric nitrate plus 1% by weight p-fluorobenzoic acid. |
| 10B | Aqueous solution containing 45% by weight ferric nitrate. |
| 11A | Aqueous solution containing 42% by weight nitric acid plus 2% by weight ammonium fluoride. |
| 11B | Aqueous solution containing 42% by weight nitric acid. |
| 12A | Aqueous solution containing 10.5% by weight nitric acid plus 0.5% by weight ammonium fluoride. |
| 12B | Aqueous solution containing 10.5% by weight nitric acid. |
| 13A | Aqueous solution containing 28% by weight nitric acid plus 0.1% by weight ammonium fluoride. |
| 13B | Aqueous solution containing 28% by weight nitric acid. |

The compositions of the invention illustrated by Examples 2A through 13A were highly satisfactory metal etches in that there was little or no reduction in dot diameter or loss of dots. However, the comparative metal etches illustrated by Examples 2B through 13B resulted in appreciable reduction in dot diameter and a significant loss in dots due to undercutting.

From the above examples, it will be readily apparent that the metal etches of the invention result in improved reproduction on copper-coated aluminum lithographic printing plates. Accordingly, the compositions of the present invention give excellent and consistent results and have completely solved the complex and frustrating problem caused by poor and inconsistent reproduction resulting from present day etches.

It will be appreciated that the compositions of the invention have application outside the graphic arts field. For example, the compositions can be used in the printed circuit industry whereby copper is etched through a stencil on an aluminum-coated nonconductive board.

It will be further appreciated that various modifications and changes can be made in the compositions and process of the invention without departing from the spirit thereof and, accordingly, the invention is to be limited only within the scope of the appended claims.

What is claimed is:

1. A metal etch composition especially adapted for developing copper-coated aluminum bi-metallic plates comprising an aqueous solution containing from about 6% to about 60% by weight of ferric nitrate copper-etching agent and from about 0.1% to about 10% by weight of a modifying agent selected from the group consisting of water-soluble and acid-soluble ionizable fluorine compounds.

2. The metal etch composition defined by claim 1 wherein the modifying agent is ammonium fluoride.

3. The metal etch composition defined by claim 1 wherein the modifying agent is sodium fluoride.

4. The metal etch composition defined by claim 1 wherein the modifying agent is chromic fluoride.

5. The metal etch composition defined by claim 1 wherein the modifying agent is fluoboric acid.

6. The metal etch composition defined by claim 1 wherein the modifying agent is p-fluorobenzoic acid.

7. A method for developing a bi-metallic plate having a partially exposed upper layer of copper and a base layer of aluminum which comprises etching said bi-metallic plate with the metal etch composition of claim 1 at a temperature and for a time sufficient to remove the partially exposed upper layer of copper while retarding undercutting.

References Cited

UNITED STATES PATENTS

| | | | |
|---|---|---|---|
| 2,872,302 | 2/1959 | Bulan | 156—18 |
| 2,584,317 | 2/1952 | Aller. | |
| 2,637,634 | 5/1953 | Howard et al. | 252—79.3 |
| 2,847,286 | 8/1958 | Neunzig et al. | 156—21 |
| 2,981,609 | 4/1961 | Acker | 252—79.3 |

JACOB H. STEINBERG, Primary Examiner

U.S. Cl. X.R.

156—3; 252—79.3